United States Patent
Park et al.

(10) Patent No.: US 7,061,034 B2
(45) Date of Patent: Jun. 13, 2006

(54) MAGNETIC RANDOM ACCESS MEMORY INCLUDING MIDDLE OXIDE LAYER AND METHOD OF MANUFACTURING THE SAME

(75) Inventors: Sang-jin Park, Pyeongtae-si (KR); Tae-wan Kim, Yongin-si (KR); Jung-hyun Lee, Yongin-si (KR); Wan-jun Park, Seoul (KR); I-hun Song, Scongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 11 days.

(21) Appl. No.: 10/830,119

(22) Filed: Apr. 23, 2004

(65) Prior Publication Data
US 2004/0211995 A1 Oct. 28, 2004

(30) Foreign Application Priority Data
Apr. 23, 2003 (KR) ........................ 10-2003-0025716

(51) Int. Cl.
*H01L 31/062* (2006.01)
(52) U.S. Cl. ...................... 257/294; 438/3; 438/253; 438/257; 438/593
(58) Field of Classification Search .................. 438/3, 438/253, 257, 593
See application file for complete search history.

(56) References Cited

U.S. PATENT DOCUMENTS

| | | | |
|---|---|---|---|
| 6,347,049 B1 | 2/2002 | Childress et al. | |
| 6,855,563 B1 * | 2/2005 | Motoyoshi | 438/3 |
| 6,893,978 B1 * | 5/2005 | Kula | 438/765 |
| 2002/0076940 A1 | 6/2002 | Hibino | |
| 2002/0196591 A1 | 12/2002 | Hujanen et al. | |
| 2003/0228710 A1 | 12/2003 | Drewes | |
| 2004/0101702 A1 | 5/2004 | Kim et al. | |

FOREIGN PATENT DOCUMENTS

| | | |
|---|---|---|
| KR | 2003-0001106 | 1/2003 |
| WO | WO 02/45167 A2 | 6/2002 |
| WO | WO 02/45167 A3 | 6/2002 |

OTHER PUBLICATIONS

Inomata, "Present and Future of Magnetic RAM Technology", IEICE Transactions on Electronics, Institute of Electronics Information and Comm. Eng., Tokyo, JP vol. E84-C, No. 6, pp. 740-746 (Jun. 2001).

* cited by examiner

*Primary Examiner*—Mai-Huong Tran
(74) *Attorney, Agent, or Firm*—Lee & Morse, P.C.

(57) ABSTRACT

In a magnetic random access memory (MRAM) having a transistor and a magnetic tunneling junction (MTJ) layer in a unit cell, the MTJ layer includes a lower magnetic layer, an oxidation preventing layer, a tunneling oxide layer, and an upper magnetic layer, which are sequentially stacked. The tunneling oxide layer may be formed using an atomic layer deposition (ALD) method. At least the oxidation preventing layer may be formed using a method other than the ALD method.

7 Claims, 6 Drawing Sheets

MAGNETIC RANDOM ACCESS MEMORY INCLUDING MIDDLE OXIDE LAYER AND METHOD OF MANUFACTURING THE SAME

BACKGROUND OF THE INVENTION

1. Field of the Invention

The present invention relates to a semiconductor memory device and a method of manufacturing the same. More particularly, the present invention relates to a magnetic random access memory (MRAM) including a middle oxide layer and an oxidation prevention layer. Further, the present invention relates to a method for providing such an MRAM, and may be a hetero-method.

2. Description of the Related Art

A magnetic random access memory (MRAM) is a memory device for reading and writing data using a phenomenon that resistance values of a magnetic tunneling junction (MTJ) layer change according to a magnetization direction of two magnetic layers forming the MTJ layer.

An MRAM may be highly integrated and can perform high-speed operations similar to a dynamic random access memory (DRAM) or a synchronous dynamic random access memory (SRAM). An MRAM also has a non-volatile characteristic so that data may be stored for a long time without requiring a refresh operation.

FIG. 1 illustrates a cross-section of a general structure of an MRAM. As illustrated in FIG. 1, an MRAM generally includes a transistor T performing a switching process and one MTJ layer S, which is electrically connected to the transistor T and where data such as "0" and "1" are written.

Referring to FIG. 1, in a conventional method of manufacturing an MRAM, a gate stacking material 12, which includes a gate electrode, is formed on a semiconductor substrate 10. Source and drain areas 14 and 16 are formed at both sides of the gate stacking material 12 in the semiconductor substrate 10. The gate stacking material 12 and the source and drain areas 14 and 16 together form the transistor T, which performs a switching process. In FIG. 1, reference numeral 11 indicates a field oxide layer. An interlayer insulating layer 18 covering the transistor T is formed on the semiconductor substrate 10. A data line 20, covered by the interlayer insulating layer 18, is then formed over and in parallel with the gate stacking material 12. A contact hole 22, exposing the drain area 16, is formed in the interlayer insulating layer 18. Then, the contact hole 22 is filled with a conductive plug 24, and a pad conductive layer 26 contacting the top surface of the conductive plug 24 is formed on the interlayer insulating layer 18. More specifically, the pad conductive layer 26 is formed over the data line 20.

In addition, the MTJ layer S is formed on an area of the pad conductive layer 26 corresponding to the data line 20. A second interlayer insulating layer 28 covering the pad conductive layer 26 and the MTJ layer S is formed on the first interlayer insulating layer 18. A via hole 30 exposing an upper layer of the MTJ layer S is formed in the second interlayer insulating layer 28. A bit line 32 filling the via hole 30 is formed on the second interlayer insulating layer 28 in a direction vertical to the gate electrode and the data line 20.

The MTJ layer S included in the MRAM of FIG. 1 is formed as shown in FIGS. 2 and 3.

As shown in FIG. 2, a lower magnetic layer S1, a tunneling barrier layer S2, and an upper magnetic layer S3 are sequentially formed on a predetermined area of the pad conductive layer 26. Then, a mask pattern M, limiting an area in which the MTJ layer S will be formed, is formed on the upper magnetic layer S3.

The tunneling barrier layer S2 is formed by depositing a metal layer, such as an aluminum Al layer, on the lower magnetic layer S1 and oxidizing the metal layer. In order to oxidize the metal layer, plasma oxidation, UV oxidation, natural oxidation, or ozone oxidation may be used.

Thereafter, as shown in FIG. 3, the MTJ layers are completely formed on the pad conductive layer 26 by etching the above sequentially formed material layers in a reverse order to an order in which they were disposed using the mask pattern M as an etching mask. Thereafter, the mask pattern M is removed. Ion milling using an argon gas, dry etching using a chlorine gas, or reactive ion etching may be used for etching the sequentially formed material layers in the reverse order. In addition, the MTJ layer S may be formed by a lift-off method. Generally, the tunneling barrier layer S2 of the MRAM should be formed uniformly without defects for tunneling to be spin-dependent.

As described above, in the conventional method of forming an MRAM, the tunneling barrier layer S2 is formed by oxidizing a metal layer using plasma oxidation, UV oxidation, natural oxidation, or ozone oxidation. However, some problems may arise due to the oxidation process of the metal layer.

In particular, when the metal layer is oxidized using the plasma oxidation method, an interface of thin layers including the lower magnetic layer S1, which is located under the metal layer, may be damaged. As a result, a magnetic resistance (MR) ratio of the MTJ layer S and/or the stability of the MRAM may be decreased.

Moreover, when the metal layer is oxidized using methods other than the plasma oxidation method, a thickness uniformity of the tunneling barrier layer S2 may be changed. A change in the thickness uniformity of the tunneling barrier layer S2 along with a change in a thickness uniformity of the metal layer, which is inevitable due to the manufacturing process, may dramatically alter characteristics such as the MR ratio of the MRAM.

One solution to the above problems is to form the MTJ layer S of the MRAM using an atomic layer deposition (ALD) method. In a case where the MTJ layer S of the MRAM is formed by an ALD method, a target material layer, i.e., the tunneling barrier layer S2, may be formed to have a uniform thickness. However, since characteristics of the interface of the target material layer and a material layer placed under the target material layer are altered, the MR ratio of the MRAM is decreased.

SUMMARY OF THE INVENTION

The present invention is therefore directed to a magnetic random access memory (MRAM), which substantially overcomes one or more of the problems due to the limitations and disadvantages of the related art.

It is a feature of an embodiment of the present invention to provide a magnetic random access memory (MRAM) in which a tunneling oxide layer of a magnetic tunneling junction (MTJ) layer has a uniform thickness.

It is another feature of an embodiment of the present invention to provide a magnetic random access memory (MRAM), which prevents a magnetic resistance (MR) ratio of the MRAM from being decreased due to a damaged lower layer disposed under an MTJ layer.

In addition, it is another feature of an embodiment of the present invention to provide a method of manufacturing the MRAM.

At least one of the above and other features and advantages of the present invention may be realized by providing an MRAM having one transistor and one MTJ layer in a unit cell, wherein the MTJ layer may be formed by sequentially stacking a lower magnetic layer, an oxidation preventing layer, a tunneling oxide layer, and an upper magnetic layer.

The oxidation preventing layer may be formed of an $AlO_x$ layer and the tunneling oxide layer may be formed of one of an $AlO_x$ layer, an $Al_xHf_{1-x}O_y$ layer and a $Fe_3O_4$ layer.

The tunneling oxide layer may have a repeating structure in which respective components of the tunneling oxide layer are sequentially stacked in each atomic layer unit.

One of the upper and lower magnetic layers may include a free ferromagnetic layer.

A data line may be formed in the MRAM to be a magnetic field generating element for writing data to the MTJ layer.

At least one of the above and other features and advantages of the present invention may be realized by providing a method of manufacturing an MRAM having a transistor and an MTJ layer in a unit cell, wherein the MTJ layer is formed by sequentially stacking a lower magnetic layer, an oxidation preventing layer, a tunneling oxide layer, and an upper magnetic layer, and wherein the tunneling oxide layer is formed by an atomic layer deposition (ALD) method and at least the oxidation preventing layer among the lower magnetic layer, the oxidation preventing layer, and the upper magnetic layer is formed using a method other than the ALD method.

The oxidation preventing layer may be formed using a sputtering method. The oxidation preventing layer may be formed of an AlOx layer and the tunneling oxide layer may be formed of an AlOx layer, an AlxHf1-xOy layer, or a Fe3O4 layer.

The upper and lower magnetic layers may be formed using a sputtering method or an ALD method. One of the upper and lower magnetic layers may include a free ferromagnetic layer.

At least one of the above and other features and advantages of the present invention may be realized by providing a method of manufacturing an MRAM having a transistor and an MTJ layer in a unit cell, the MTJ layer having middle oxide layers formed by a hetero-method, the method including forming the transistor including a gate stacking material and source and drain regions in an active area of a substrate, forming a pad conductive layer on an interlayer insulating layer formed over the transistor, the pad conductive layer being electrically associated with the drain region of the transistor, forming the MTJ layer in a predetermined area of the pad conductive layer corresponding to a data line formed under the pad conductive layer by sequentially depositing a seed layer, a lower magnetic layer, an oxidation preventing layer, a tunneling oxide layer, and an upper magnetic layer, and patterning the upper magnetic layer, the tunneling oxide layer, the oxidation preventing layer, the lower magnetic layer, and the seed layer to form the MTJ layer, wherein the tunneling oxide layer is formed by an atomic layer deposition (ALD) method and at least the oxidation preventing layer is formed by a method other than the ALD method.

At least one of the above and other features and advantages of the present invention may be realized by providing a method of manufacturing a magnetic tunneling junction (MTJ) layer having middle oxide layers formed by a hetero-method, the method including forming a seed layer, forming a lower magnetic layer including a pinning layer and a pinned layer on the seed layer, forming a metal layer on the lower magnetic layer, oxidizing the metal layer to form an oxidation preventing layer on the pinned layer of the lower magnetic layer, sequentially forming a tunneling oxide layer and an upper magnetic layer on the oxidation preventing layer, and patterning the upper magnetic layer, the tunneling oxide layer, the oxidation preventing layer, the lower magnetic layer and the seed layer to form the MTJ layer, wherein the tunneling oxide layer is formed using an atomic layer deposition (ALD) method and at least the oxidation preventing layer is formed using a method other than the ALD method.

The upper and lower magnetic layers may be formed using sputtering or the ALD method.

A tunneling oxide layer according to the present invention may be formed to have a uniform thickness that can be easily adjusted. As a result, resistance of the MTJ layer may also be easily adjusted and a resistance variation between memory cells may be reduced. In addition, a decrease in MR ratio of an MRAM according to the present invention may be prevented by minimizing or precluding any damage to the lower magnetic layer when forming the tunneling oxide layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
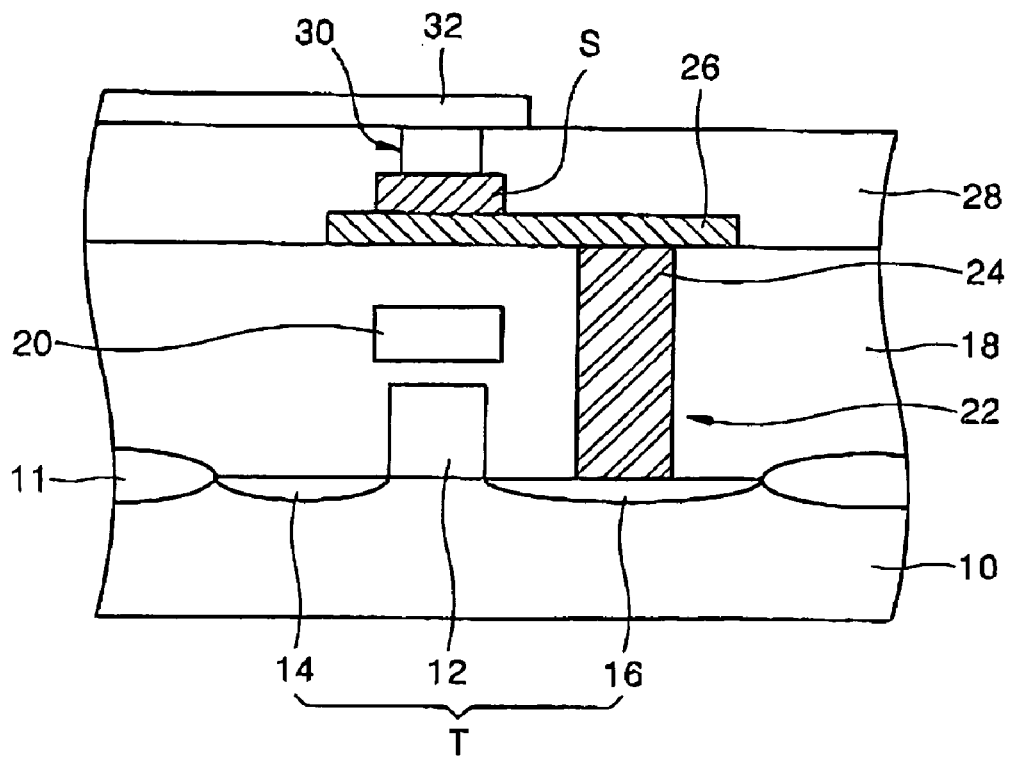
FIG. 1 illustrates a cross-section of a general structure of a magnetic random access memory (MRAM)
Figure 2:
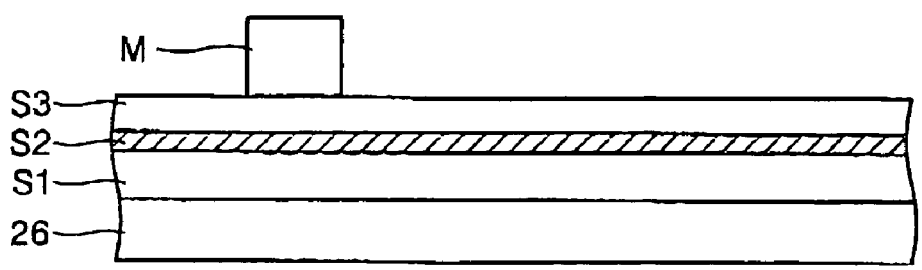
FIG. 2 illustrates a cross-section of a structure and a method of forming a magnetic tunneling junction (MTJ) layer of the MRAM of FIG. 1 in accordance with the order in which the structure is formed.
Figure 3:
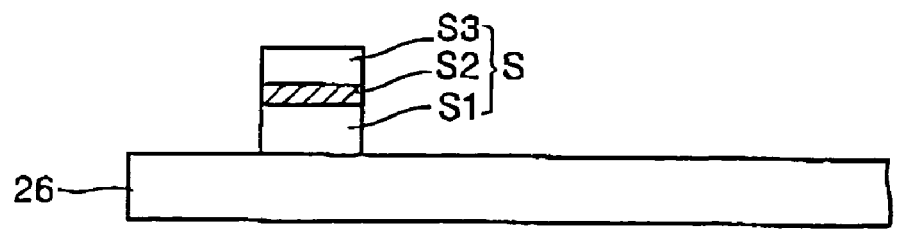
FIG. 3 illustrates a cross-section sequentially illustrating an MTJ layer of the MRAM of FIG. 1.

Korean Patent Application No. 2003-25716, filed on Apr. 23, 2003, in the Korean Intellectual Property Office, and entitled, "Magnetic Random Access Memory Comprising Middle Oxide Layer Formed By Hetero-Method And Method Of Manufacturing The Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A magnetic random access memory (MRAM) according to an embodiment of the present invention will now be described with reference to FIG. 4.

Figure 4:
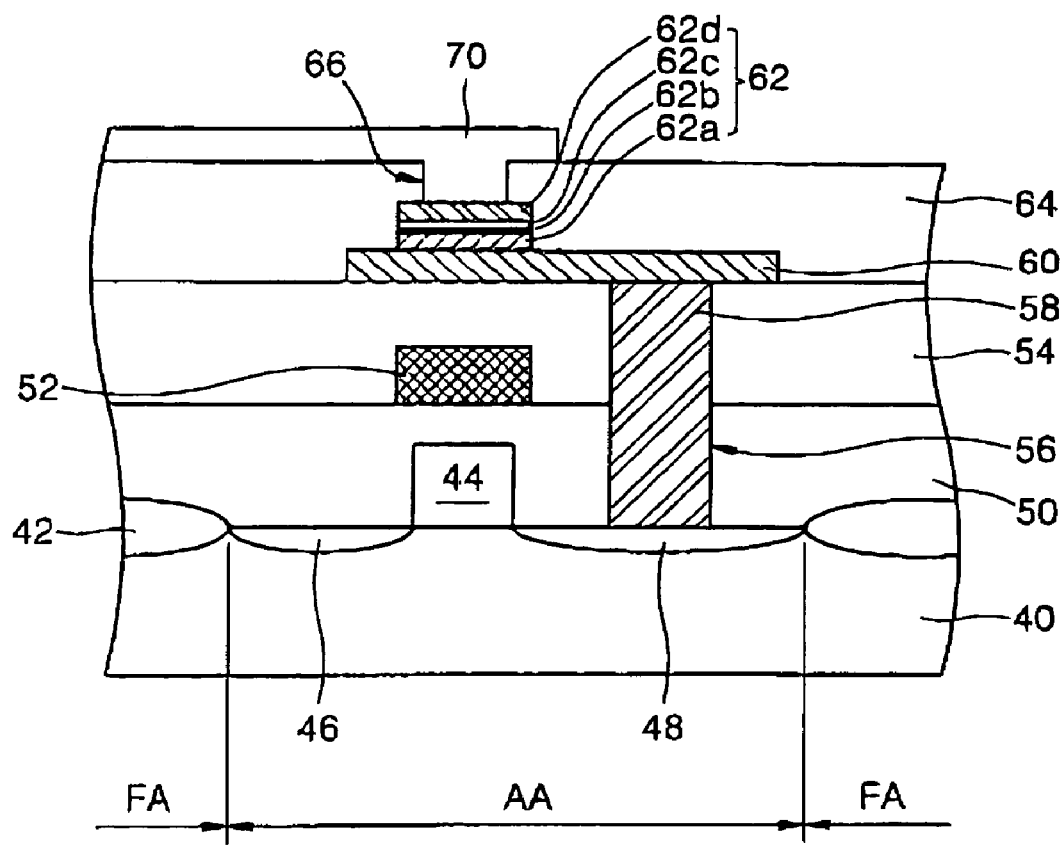
FIG. 4 illustrates a cross-section of an MRAM including a middle oxide layer formed by a hetero-method according to an embodiment of the present invention.

FIG. 4 illustrates a cross-section of an MRAM including middle oxide layers formed by a hetero-method according to an embodiment of the present invention.

Referring to FIG. 4, an active area (AA) and two field areas (FAs) are provided in a semiconductor substrate 40. A field oxide layer 42 is formed in the FAs. A transistor, including a gate stacking material 44 and source and drain areas 46 and 48, is formed in the AA which is located between the two FAs. A first interlayer insulating layer 50, covering the transistor, is formed on the semiconductor substrate 40 and a data line 52, corresponding to the gate stacking material 44, is formed on the first interlayer insulating layer 50.

The data line 52 may be a magnetic field generating element for writing data to an MTJ layer 62. A magnetic field passing an MTJ layer 62 is generated around the data line 52 as a predetermined current is applied to the data line 52 to write data. In this case, the transistor is in an off-state.

A second interlayer insulating layer 54 covering the data line 52 is formed on the first interlayer insulating layer 50. A contact hole 56, which is separated by a predetermined distance from the data line 52 and the gate stacking material 44, is formed in the first and second interlayer insulating layers 50 and 54. The drain area 48 of the transistor is exposed through the contact hole 56, which is filled with a conductive plug 58. A pad conductive layer 60 contacting the top of the conductive plug 58 is extended over the data line 52 on the second interlayer insulating layer 54. The pad conductive layer 60 may be formed by sequentially depositing a titanium (Ti) layer and a titanium nitride (TiN) layer. The MTJ layer 62 may be formed in a predetermined area of the pad conductive layer 60 corresponding to the data line 52. The MTJ layer 62 includes a seed layer (not shown), a lower magnetic layer 62a, an oxidation preventing layer 62b, a tunneling oxide layer 62c, an upper magnetic layer 62d, and a capping layer (not shown). The lower magnetic layer 62a may be formed by sequentially stacking a pinning layer and a pinned layer. The seed layer may be a single layer or a double layer. When the seed layer is a single layer, the seed layer may be a tantalum (Ta) layer. The pinning layer may be an anti-ferromagnetic layer, for example, an IrMn layer, and the pinned layer may be a ferromagnetic layer, for example, a CoFe layer. The upper magnetic layer 62d may be a ferromagnetic layer (hereinafter referred to as a "free ferromagnetic layer") in which a direction of magnetic polarization is freely changed according to an applied magnetic field. For example, the upper magnetic layer 62d may be formed of a NiFe layer.

The structures of the lower magnetic layer 62a and the upper magnetic layer 62d may be interchanged. For example, the lower magnetic layer 62a may be a free ferromagnetic layer, and the upper magnetic layer 62d may be formed by sequentially stacking a pinned layer and a pinning layer. In this case, the lower magnetic layer 62a may be a NiFe layer, and the pinned layer and the pinning layer may be a CoFe layer and an IrMn layer, respectively.

The capping layer is intended to contact the MTJ layer 62 with a bit line 70. The capping layer may be formed of a metal layer having low contact resistance, for example, a Ta or Ru layer. The oxidation preventing layer 62b is intended to prevent an interface of the lower magnetic layer 62a from being damaged, for instance, by oxidation, when forming the tunneling oxide layer 62c. The oxidation preventing layer 62b may be a first aluminum oxide layer $AlO_x$, for example, an $Al_2O_3$ layer. The tunneling oxide layer 62c may be formed by a method that is different from a method used for forming the oxidation preventing layer 62b. For example, the tunneling oxide layer 62c may be formed by an atomic layer deposition (ALD) method.

The tunneling oxide layer 62c may be formed of an oxide layer having a predetermined thickness, for instance, a second aluminium oxide layer $AlO_x$. However, the tunneling oxide layer 62c may be an $Al_xHf_{1-x}O_y$ layer or a $Fe_3O_4$ layer. In addition, the second aluminium oxide layer $AlO_x$ may be, but is not limited to being, an $Al_2O_3$ layer.

The MTJ layer 62 of the present invention may also be applied to MRAMs other than that shown in FIG. 4. For example, the MTJ layer 62 may be applied to an MRAM including a data line placed over the MTJ layer 62 and a bit line placed under the MTJ layer 62.

A third interlayer insulating layer 64 covering the pad conductive layer 60 and the MTJ layer 62 is formed in the second interlayer insulating layer 54. A via hole 66 exposing the MTJ layer 62 is formed on the third interlayer insulating layer 64. In addition, the bit line 70, which fills the via hole 66 and contacts the MTJ layer 62, is formed on the third interlayer insulating layer 64. The bit line 70 may be perpendicular to the data line 52 and the gate stacking material 44.

Next, a method of manufacturing the MRAM having the aforementioned elements will be explained with reference to FIGS. 4 through 8.

Referring to FIG. 4, the active area (AA) and the field area (FA) are defined in the semiconductor substrate 40 and the field oxide layer 42 for device separation is formed in the FA. The gate stacking material 44 including a gate electrode is formed on the AA. The source and drain areas 46 and 48 are formed on the AA at both sides of the gate stacking material 44. Thus, the transistor is completely formed on the semiconductor substrate 40. The transistor is in an off-state when writing data to the MTJ layer 62 and in an on-state when reading data from the MTJ layer 62.

Then, the first interlayer insulating layer 50 covering the transistor is formed on the semiconductor substrate 40. The data line 52 may be formed in a predetermined area over and parallel to the gate stacking material 44 on the first interlayer insulating layer 50. The data line 52 is intended to write data to the MTJ layer 62. A predetermined current is applied to the data line 52 when writing data. The second interlayer insulating layer 54 covering the data line 52 is formed on the first interlayer insulating layer 50. Then, the contact hole 56 exposing a predetermined area of the semiconductor substrate 40 is formed in the first and second interlayer insulating layers 50 and 54. The drain area 48 of the transistor is exposed through the contact hole 56. After filling the contact hole 56 with the conductive plug 58, the pad conductive layer 60 is formed on the second interlayer insulating layer 54. The pad conductive layer 60 formed on the second interlayer insulating layer 54 contacts the top surface of the conductive plug 58 and extends over the data line 52. The MTJ layer 62 is formed on a predetermined area of the pad conductive layer 60, preferably over the data line 52.

Now, examples of specific procedures of forming the MTJ layer 62 will be explained with reference to FIGS. 5 and 8.

Figure 5:
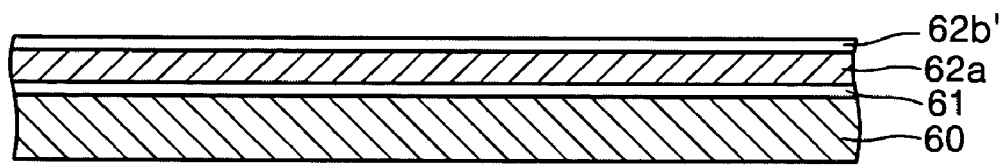
FIGS. 5 through 8 illustrate cross-sections depicting sequentially a method of forming an MTJ layer of an MRAM including a middle oxide layer formed by a hetero-method according to an embodiment of the present invention.

Referring to FIG. 5, a seed layer 61 is formed on the pad conductive layer 60, and a lower magnetic layer 62a including a pinning layer and a pinned layer is formed on the seed layer 61. The layers of the lower magnetic layer 62a are formed using a sputtering method or an ion beam deposition (IBD) method. Specific examples of the respective layers of the lower magnetic layer 62a have been mentioned before and thus will be omitted.

Figure 6:
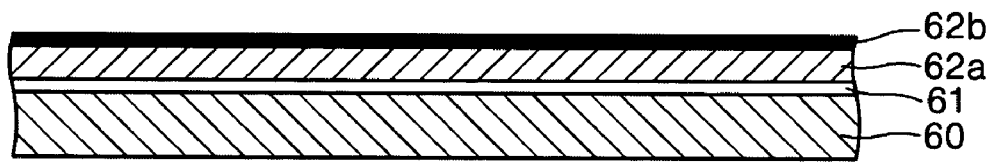

Next, a metal layer 62b', which will be used as an oxidation preventing layer in a subsequent process, is formed on the lower magnetic layer 62a. The metal layer 62b' may be formed of an aluminium layer Al using a sputtering method. Then, the metal layer 62b' is oxidized using a predetermined method, for instance, a natural oxidation method or an UV oxidation method. As a result, an oxidation preventing layer 62b, for example, an aluminium oxide layer $AlO_x$, is formed on the top layer, that is the pinned layer, of the lower magnetic layer 62a as shown in FIG. 6. The oxidation preventing layer 62b is one of the middle oxide layers, which is placed between the lower magnetic layer 62a and an upper magnetic layer 62d.

Figure 7:
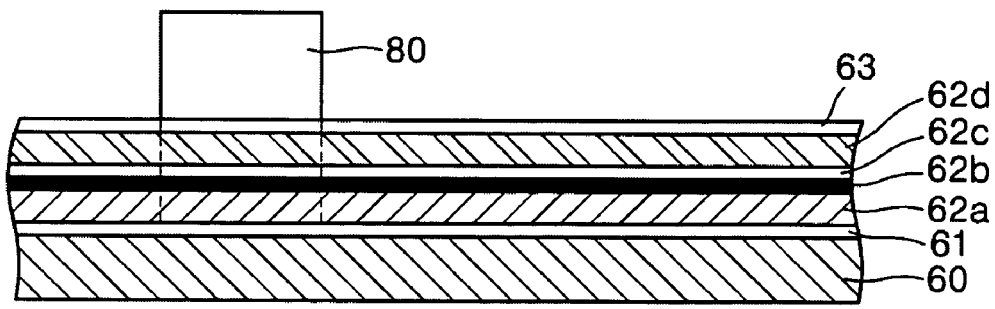

Referring to FIG. 7, a tunneling oxide layer 62c, the upper magnetic layer 62d, and capping layer 63 are sequentially formed on the oxidation preventing layer 62b. The tunneling oxide layer 62c, as one of the middle oxide layers, may be formed by the ALD method and the upper magnetic layer 62d may be formed using a sputtering method.

Specific procedures of forming the tunneling oxide layer 62c using a second aluminium oxide layer $AlO_x$ and the ALD method will now be explained.

The semiconductor substrate 40, having the oxidation preventing layer 62b formed thereon, is loaded on a wafer stage of an ALD apparatus maintained at a predetermined temperature between 150° C. and 500° C., preferably 400° C. Thereafter, a predetermined amount of a first precursor including a first reactive element, aluminium Al, is provided to the ALD apparatus and chemically absorbed into a surface of the oxidation preventing layer 62b. In particular, the first precursor is a compound including ligands of an aluminium and hydrocarbon series, for instance, $Al(CH_3)_3$, $Al(CH_2$—$CH_2$— . . . —$CH_3)_3$, or a compound with one H of $Al(CH_2$—$CH_2$— . . . —$CH_3)_3$ substituted by $CH_2$—$CH_2$— . . . —$CH_3$. The first precursor provided to the ALD apparatus that is not chemically absorbed onto the surface of the oxidation preventing layer 62b is discharged from the ALD apparatus when the ALD apparatus is ventilated. Then, a predetermined amount of a second precursor for oxidizing the first reaction element Al of the first precursor on the oxidation preventing layer 62b is provided to the ALD apparatus. The second precursor may be formed of one of $H_2O$ and $O_3$.

Then, the first and second precursors chemically react with each other. Accordingly, a reactive by-product $3CH_4$ resulting from a reaction between a ligand of the first precursor (—$CH_3$)$_3$ and H of the second precursor is formed as shown in a chemical reaction equation below, and the reactive by-product $3CH_4$ is volatilized. Thus, the tunneling oxide layer 62c, that is the aluminum oxide layer $AlO_x$, is formed on the oxidation preventing layer 62b.

<Chemical Reaction Equation>

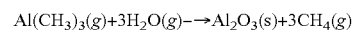

$$Al(CH_3)_3(g) + 3H_2O(g) \rightarrow Al_2O_3(s) + 3CH_4(g)$$

After the aluminium oxide layer $AlO_x$ (tunneling oxide layer 62c) is formed on the oxidation preventing layer 62b, volatile materials and other by-products are removed from the ALD apparatus by exhausting the ALD apparatus. The aforementioned procedure will be repeated until the aluminum oxide layer $AlO_x$ (tunneling oxide layer 62c) having a desired thickness is obtained.

Referring to FIG. 7, the upper magnetic layer 62d is a free ferromagnetic layer. The free ferromagnetic layer may be formed of a single ferromagnetic layer or at least two sequentially stacked ferromagnetic layers. In the former case, the free ferromagnetic layer may be formed of a NiFe layer.

After the upper magnetic layer 62d and the capping layer 63 are formed on the tunneling oxide layer 62c, a photosensitive layer (not shown) may be disposed on the capping layer 63. Then, a photosensitive pattern 80, which limits an area in which the MTJ layer 62 of FIG. 4 will be formed, may be formed by patterning the photosensitive layer using general photolithography. The material layers 61, 62a, 62b, 62c, 62d, and 63 stacked on the pad conductive layer 60 are etched in a reverse order using the photosensitive pattern 80 as an etching mask. A dotted line of FIG. 7 indicates an etching direction. This etching procedure will be continued until the pad conductive layer 60 is exposed, and thereafter the photosensitive pattern 80 may be removed by ashing and stripping.

Figure 8:
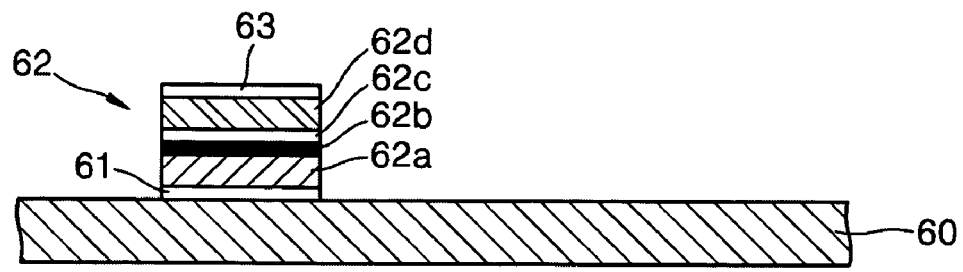

FIG. 8 illustrates a cross-section of a resulting material after the above etching process is completed and the photosensitive pattern 80 is removed. Referring to FIG. 8, the MTJ layer 62, including the seed layer 61, the lower magnetic layer 62a, the middle oxide layers 62b and 62c, and the upper magnetic layer 62d, is formed in a predetermined area of the pad conductive layer 60.

Here, referring to FIG. 4, the MTJ layer 62 is formed in a predetermined area of the pad conductive layer 60, and then, a third interlayer insulating layer 64 covering the pad conductive layer 60 and the MTJ layer 62 is formed on the second interlayer insulating layer 54. In addition, a via hole 66 exposing the MTJ layer 62 is formed in the third interlayer insulating layer 64, and thereafter, the bit line 70 filling the via hole 66 is formed on the third interlayer insulating layer 64.

EXPERIMENTAL EXAMPLE

Figure 9:
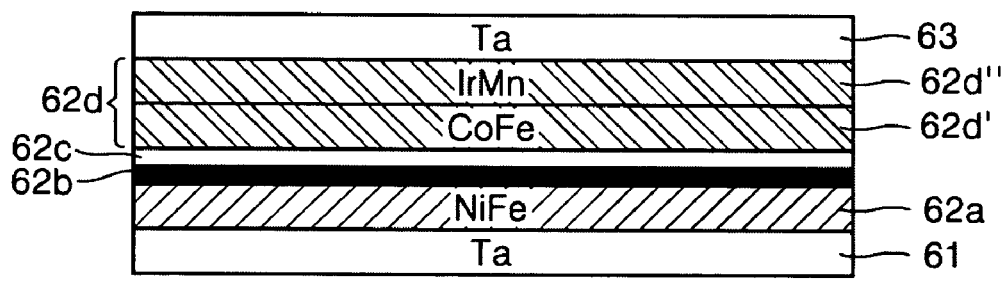
FIG. 9 illustrates a cross-section of a structure of an MTJ layer, which is used in an experimental example for measuring characteristics of an MRAM including a middle oxide layer formed by a hetero-method, according to an embodiment of the present invention.

The MTJ layer of the present invention is formed as shown in FIG. 9 in order to measure characteristics of the MTJ layer such as the MR ratio. In addition, for sake of comparison, an MTJ layer is formed as shown in FIG. 10, i.e., without an oxidation prevention layer.

Referring to FIG. 9, the seed layer 61 in the MTJ layer according to the present invention is formed of a Ta layer using sputtering. The lower magnetic layer 62a, which is a free ferromagnetic layer, is formed of a NiFe layer using sputtering. The oxidation preventing layer 62b and the tunneling oxide layer 62c forming the middle oxide layers are formed of $AlO_x$ layers. The oxidation preventing layer 62b is formed by oxidizing a metal layer, such as aluminum Al, after the metal (Al) layer is formed using a sputtering process, and the tunneling oxide layer 62c is formed by the ALD method. Furthermore, the upper magnetic layer 62d is formed by sequentially stacking a CoFe layer 62d' and an IrMn layer 62d", which act as the pinned layer and the pinning layer, respectively, using sputtering. The seed layer 61 and the capping layer 63 may be substituted with Ru layers.

Figure 10:
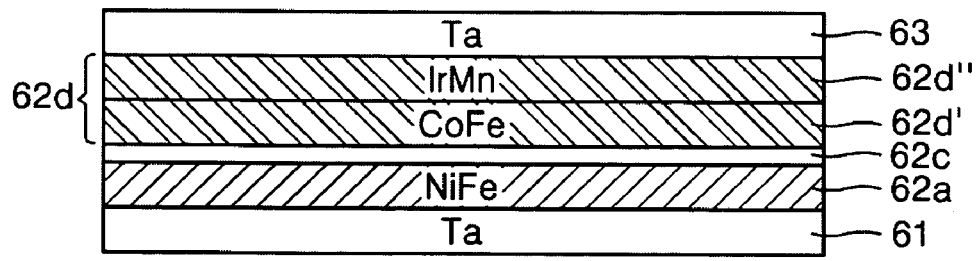
FIG. 10 illustrates a cross-section of an MTJ layer as a control for comparison with the MTJ layer of FIG. 9.

The comparative MTJ layer of FIG. 10 is formed without the oxidation preventing layer 62b of the MTJ layer of an embodiment of the present invention shown in FIG. 9.

Figure 11:
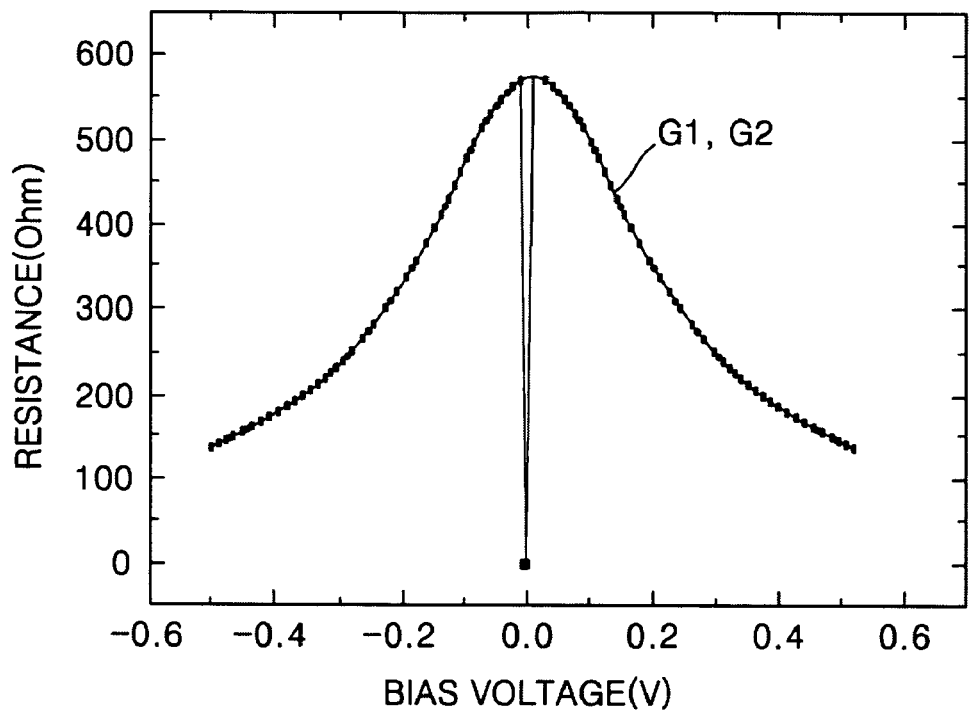
FIG. 11 is a graph illustrating resistance changes in the MTJ layer of FIG. 10 according to bias voltage.
Figure 12:
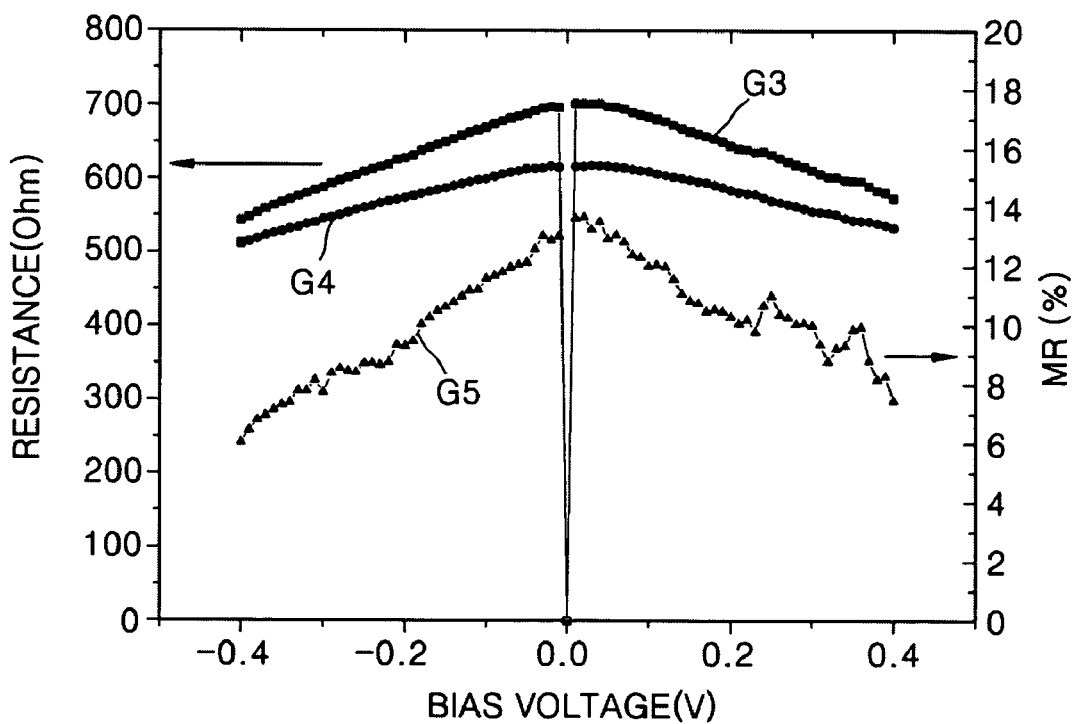
FIG. 12 is a graph illustrating a magnetic resistance (MR) ratio and a resistance of the MTJ layer of FIG. 9 according to bias voltage.
Figure 13:
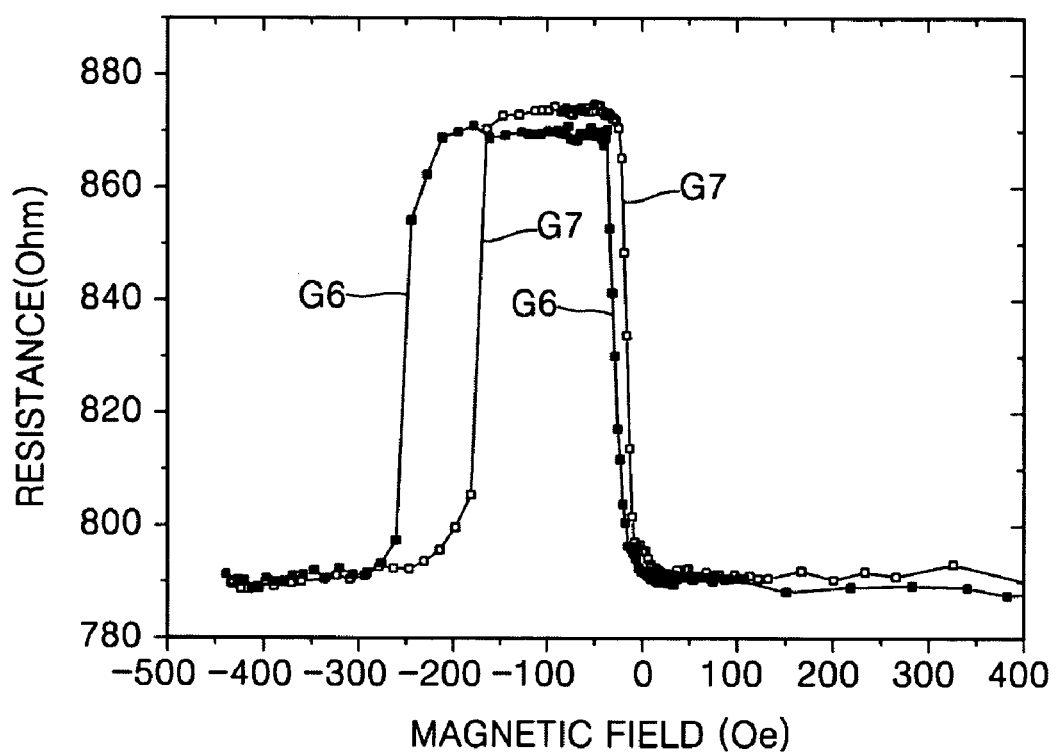
FIG. 13 is a graph illustrating resistance changes according to changes in a magnetic field applied to the MTJ layer when a predetermined bias voltage is applied to the MTJ layer of FIG. 9.

FIGS. 11 through 13 illustrate graphs for showing characteristics of the comparative MTJ layer and the MTJ layer of the present invention.

In particular, FIG. 11 illustrates first and second graphs G1 and G2 representing resistance changes of the comparative MTJ layer according to a bias voltage. The first graph G1 illustrates resistance changes when magnetic directions of the upper and lower magnetic layers 62a and 62d of the comparative MTJ layer are the same. The second graph G2 illustrates resistance changes when the magnetic directions of the upper and lower magnetic layers 62a and 62d of the comparative MTJ layer are opposite.

Referring to FIG. 11, the first and second graphs G1 and G2 overlap, thereby showing that the resistance of the comparative MTJ layer is the same regardless of the magnetic directions of the upper and lower magnetic layers 62a and 62d. Therefore, the MR ratio of the comparative MTJ layer is 0%.

FIG. 12 illustrates third and fourth graphs G3 and G4 representing resistance changes of an MTJ layer of the present invention according to a bias voltage and a fifth graph G5 indicating changes in the MR ratio. In particular, the third graph G3 shows the resistance changes when magnetic directions of the upper and lower magnetic layers 62a and 62d of the MTJ of the present invention are opposite, and the fourth graph G4 shows resistance changes when the magnetic directions of the upper and lower magnetic layers 62a and 62d of the MTJ of the present invention are the same.

Referring to FIG. 12, unlike the first and second graphs G1 and G2 of FIG. 11, the third and fourth graphs G3 and G4 are separated by a predetermined distance. This means that the resistance of the MTJ layer of the present invention varies according to the magnetic directions of the upper and lower magnetic layers 62a and 62d, and thus, the MTJ layer of the present invention has a predetermined MR ratio as shown in the fifth graph G5.

Referring to the fifth graph G5, the MR ratio of the MTJ layer of the present invention is 0.13 or 13% at the predetermined bias voltage of, for example, 100 mV. It is possible to determine whether the magnetic directions of the upper and lower magnetic layers 62a and 62d are the same or opposite by using the MR ratio. That is, it is possible to sense whether data "1" or "0" is recorded.

FIG. 13 illustrates sixth and seventh graphs G6 and G7 representing resistance changes of the MTJ layer of the present invention according to changes in a magnetic field H applied to the MTJ layer when a bias voltage is fixed at a predetermined value of, for example, 400 mV. Although the sixth and seventh graphs G6 and G7 are to be a continuous single graph, they are illustrated separately to provide an easy explanation.

The sixth graph G6 illustrates resistance changes of the MTJ layer 62 of the present invention when the strength of the magnetic field H, applied to the MTJ layer 62, is gradually decreased until the strength of the magnetic field H is "0". When the strength of the magnetic field H is "0", the magnetization directions of the upper and lower magnetic layers 62a and 62d of the MTJ layer are equalized. Then, still illustrated in graph G6, the strength of the magnetic field H is gradually increased in order to make the magnetization directions of the upper and lower magnetic layers 62a and 62d opposite each other.

After the strength of the magnetic field H becomes "0", when the magnetic field H is strengthened in a direction opposite to the original direction, the magnetization directions of the upper and lower magnetic layers 62a and 62d become opposite each other. Therefore, resistance of the MTJ layer of the present invention is increased as shown in the sixth graph G6. However, when the strength of the magnetic field H is continuously increased, for instance up to near −300(Oe), the magnetization directions of the upper and lower magnetic layers of the MTJ layer of the present invention become the same again, and thus, the resistance of the MTJ layer of the present invention is decreased. A flat left portion of the sixth graph G6 illustrates this case.

The seventh graph G7 illustrates resistance changes starting from a right end of the flat left portion of the sixth graph G6. That is, the seventh graph G7 illustrates resistance changes of the MTJ layer of the present invention when the strength of the magnetic field H, applied to the MTJ layer 62, is gradually decreased to "0", and then, after the magnetic directions of the upper and lower magnetic layers have become the same again, when the strength of the magnetic field H is gradually increased in an opposite direction.

As described above, an MRAM according to embodiments of the present invention includes a tunneling oxide layer, which is formed by an ALD method, and an oxidation preventing layer, which is formed by using a sputtering method and which is located under the tunneling oxide layer. The oxidation preventing layer prevents oxidation of the interface of the lower magnetic layer when forming the tunneling oxide layer by the ALD method. Accordingly, the oxidation preventing layer may prevent the MR ratio of the MTJ layer from decreasing while forming the tunneling oxide layer having a uniform thickness.

Exemplary embodiments of the present invention have been disclosed herein and, although specific terms are employed, they are used and are to be interpreted in a generic and descriptive sense only and not for purpose of limitation. This invention may, however, be embodied in many different forms and should not be construed as being limited to the embodiments set forth herein. For example, the lower and upper magnetic layers 62a and 62d of the MTJ layer 62 including the tunneling oxide layer 62c and the oxidation preventing layer 62b may have different structures. In addition, the MTJ layer according to the exemplary embodiments of the present invention may be applied to an MRAM having the data line 52 and the bit line 70 in different structures. Also, the tunneling oxide layer 62c may be formed of a different type of oxide layer and other types of non-oxide layers playing an equivalent role. Further, the oxidation preventing layer 62b may be formed of an oxide layer differing from $AlO_x$ or a non-oxide layer.

Accordingly, it will be understood by those of ordinary skill in the art that various changes in form and details may be made to the embodiments disclosed herein without departing from the spirit and scope of the present invention as set forth in the following claims.

What is claimed is:

1. A magnetic random access memory (MRAM) having a transistor and a magnetic tunneling junction (MTJ) layer in a unit cell, the MTJ layer comprising:
    a lower magnetic layer;
    an oxidation preventing layer;
    a tunneling oxide layer; and
    an upper magnetic layer,
    wherein the lower magnetic layer, the oxidation preventing layer, the tunneling oxide layer, and the upper magnetic layer are sequentially stacked and the oxidation preventing layer is arranged between the lower magnetic layer and the upper magnetic layer.

2. The MRAM as claimed in claim 1, wherein the oxidation preventing layer is formed of an $AlO_x$ layer.

3. The MRAM as claimed in claim 1, wherein the tunneling oxide layer is formed of one of an $AlO_x$ layer, an $Al_xHf_{1-x}O_y$ layer, and a $Fe_3O_4$ layer.

4. The MRAM as claimed in claim 1, wherein the tunneling oxide layer has a repeating structure of sequentially stacked atomic layers.

5. The MRAM as claimed in claim 2, wherein the tunneling oxide layer is formed of one of an $AlO_x$ layer, an $Al_xHf_{1-x}O_y$ layer, and a $Fe_3O_4$ layer.

6. The MRAM as claimed in claim 1, wherein one of the upper and lower magnetic layers includes a free ferromagnetic layer.

7. The MRAM as claimed in claim 1, wherein a data line is formed in the MRAM to be a magnetic field generating element for writing data to the MTJ layer.

* * * * *